United States Patent

[11] 3,593,413

[72] Inventor Wilhelm Kafka
Tennenlohe, Germany

[21] Appl. No. 849,555
[22] Filed July 22, 1969
[45] Patented July 20, 1971
[73] Assignee Siemens Aktiengesellschaft
Erlanger, Germany
[32] Priority Aug. 31, 1965
[33] Germany
[31] S 99151
Continuation of application Ser. No. 575,117, Aug. 25, 1966, now abandoned.

[54] METHOD OF MANUFACTURING POWER-CURRENT CRYOTRONS
9 Claims, 1 Drawing Fig.

[52] U.S. Cl. 29/599, 307/88.5, 29/195
[51] Int. Cl. H01v 11/00
[50] Field of Search 29/599, 420, 420.5, 191.2, 195, 1; 307/88.5

[56] References Cited
UNITED STATES PATENTS

| | | | |
|---|---|---|---|
| 3,106,648 | 10/1963 | McMahon et al. | 307/88.5 |
| 3,116,422 | 12/1963 | May et al. | 307/88.5 |
| 3,144,704 | 4/1964 | Quinn | 29/599 |
| 3,191,055 | 6/1965 | Swihart et al. | 307/88.5 |
| 3,218,693 | 11/1965 | Allen et al. | 29/599 |
| 3,258,828 | 7/1966 | Swartz | 29/599 |
| 3,327,370 | 6/1967 | Cohen | 29/599 |
| 3,370,347 | 2/1968 | Garwin et al. | 29/599 |

OTHER REFERENCES
IBM TECHNICAL DISC. BULL. Vol. 3, #11, 4/61 Pg. 49 "Camial Cryotronic Structures." By G. C. Stierhoft.

*Primary Examiner*—John F. Campbell
*Assistant Examiner*—W. C. Tupman
*Attorneys*—Curt M. Avery, Arthur E. Wilford, Herbert L. Lerner and Daniel J. Tick

ABSTRACT: Described is a method of manufacturing a power-current cryotron having a layered gate-conductor structure which in the normal conducting state at the cryotron operating temperature has a free electron path length smaller than in the superconductor material of the cryotron. The method comprises steps of situating a pulverulent insulating material between a plurality of layers of superconductor material, and then compressing the layers together with the pulverulent insulating material therebetween to reduce the cross-sectional area of the cryotron. The superconductor material is selected from the group consisting of lead and niobium and the pulverulent insulating material is selected from magnesium oxide and aluminum oxide.

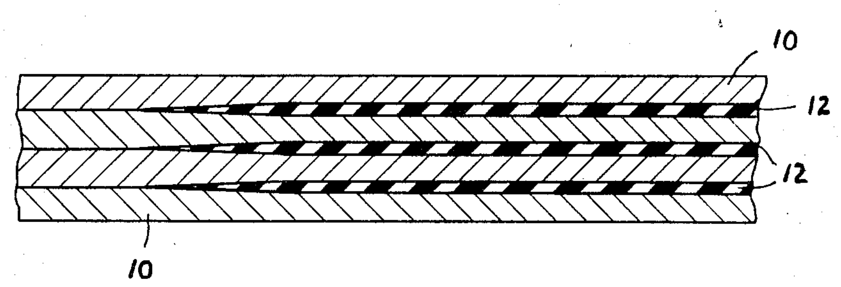
10
12
12
10

METHOD OF MANUFACTURING POWER-CURRENT CRYOTRONS

The present application is a streamlined continuation of Application Ser. No. 575,117, filed Aug. 25, 1966, now abandoned, and relates to a method of manufacturing controllable electric resistance or switching devices having a gate-conductor of superconductance material switchable by means of a controlled magnetic field between superconducting and normal conducting states. These devices, called cryotrons, are employed for communication and data-processing purposes, for example as memory devices or other logic components in computers.

Most significant for such and other low-current purposes is the extreme switching speed. This quality is less important when attempting to use cryotrons for the control of power current, such as on the order of amperes or hundreds of amperes, where predominantly other requirements must be met. In the first place, a power-current cryotron would have to possess a high current-carrying capacity in the superconducting state. However, it must also be capable of blocking a high voltage without appreciable losses when in the normal conducting state. This means that the gate-conductor of the cryotron, this being the conductor which switches between superconductivity and normal conductivity, must possess a highest possible product of critical current intensity times specific conductance in the state of normal conductivity at the cryogenic operating temperature. To be sure, by multiplying the effective length of the gate-conductor, the losses for a given switching power can be reduced. In a known power-current cryotron, such multiplication in length is obtained by folding a superconductor tape. This solution, however, is not satisfactory because it requires a large amount of material and much space. Furthermore, the device neither modifies the critical current density nor the specific resistance at normal conductance.

A far better solution to the problem has already been proposed. According to this latter solution, the gate-conductor has a filamentary, laminated or spongy structure which in the normal conducting state at the cryotron operating temperature has a free electron path length smaller than in the superconductor material itself.

It is an object of my invention to provide a method of manufacturing a power-current cryotron of this latter general type.

In particular, it is an object of my invention to provide a method of manufacturing a power-current cryotron which will, as a result of the method of manufacture of my invention, have an extremely small size while at the same time being capable of satisfying all of the technical requirements.

In accordance with the method of my invention the gate-conductor of the power-current cryotron has a layered or laminated structure which in the normal conducting state at the operating temperature of the cryotron has for its electrons a free path length smaller than that of the superconductor material itself, this manufacturing method of my invention including the steps of situating between relatively thin layers or laminations of superconductor material a pulverulent insulating material, and then compressing the layers together with the pulverulent insulating material situated therebetween so as to reduce the cross section of the structure.

My invention is illustrated by way of example in the accompanying drawing which forms part of this application and in which only a portion of the gate-conductor structure is illustrated at a highly enlarged scale.

In accordance with my invention, approximately one thousand relatively thin layers or laminations of lead, of which only four layers 10 are shown, instead of one thousand layers of superconductor material, are situated one over the other in the manner illustrated in the drawing with alternating layers of pulverulent insulating material situated therebetween. These layers of lead can be in the form of lead foils having a thickness of 20 $\mu$, while the intermediate layers of pulverulent insulating material can be in the form of magnesium oxide powder. The amount of magnesium oxide corresponds in volume to the amount of lead. The entire laminated assembly is then compressed as by being passed between suitable rollers so as to reduce its cross section, until the entire structure has a total thickness of 0.2 mm. Thus, the lead foils or laminations have only a thickness of approximately 0.2 $\mu$, and the oxide grains press into and through the lead foils and provide them with a toothed configuration.

A tape of this construction has at 10° K a specific conductance of approximately $10^{14}\ \Omega$ cm. The conductance value per cm. of tape length of a tape which is 10 mm. wide is then $0.5\times10^{12}\ \Omega$ cm. In the superconductive state it can conduct approximately 10 KA. If it is required, for example, to block a direct-current voltage of 10 V until there is a residual current of 1 A, then the tape having the above properties and dimensions must have a length of 2,000 cm. For this purpose the tape can be folded 20 times to a length of 100 cm., producing a total thickness, including that of the insulating supporting structure, of approximately 10 mm. The insulating supporting structure can take the form, for example, of thin foils of mica.

The drawing illustrates the grains 12 of pulverulent insulating material situated between the layers 10 of superconductor material in a schematic manner. It is to be noted, moreover, that at the left end portion of the drawing the thickness of the laminations or layers 10 increase and they directly engage each other without any insulating material therebetween. This latter construction shown at the left portion of the drawing is provided at those locations where electrical connections are to be made with the tape. Thus, for the purpose of electrically connecting the cryotron gate-conductor with a hard superconductor material either the width and/or the thickness of the tape is increased, as shown at the left portion of the drawing, and this structure can be provided at the ends of the tape. It is also possible to situate at the ends of the superconductor layers, in place of the pulverulent insulating material, metal foils such as foils of copper which alternate with the foils 10 so that in this way the heat which develops is easier to remove.

Of course, materials different from those referred to above can be used. For example, instead of using lead foil for the layers which form the superconductor material of the gate-conductor, it is possible to use niobium, and instead of using magnesium oxide powder for the pulverulent insulating material, it is possible to use aluminum oxide powder.

I claim:

1. In a method of manufacturing a power-current cryotron having a layered gate-conductor structure which in the normal conducting state at the cryotron operating temperature has a free electron path length smaller than in the superconductor material of the cryotron, the steps of situating a layer of pulverulent insulating material between a plurality of layers of superconductor material, and then compressing the layers together with the pulverulent insulating material therebetween to reduce the cross-sectional area of the cryotron.

2. In a method as recited in claim 1, compressing the layers together in a press.

3. In a method as recited in claim 1, compressing the layers together by passing them between rollers.

4. In a method as recited in claim 1, said superconductor material being lead.

5. In a method as recited in claim 1, said superconductor material being niobium.

6. In a method as recited in claim 1, said pulverulent insulating material being magnesium oxide.

7. In a method as recited in claim 1, said pulverulent insulating material being aluminum oxide.

8. In a method as recited in claim 1 and wherein said gate-conductor structure is in the form of a tape having locations where electrical connections are made thereto, the step of providing the tape at the latter locations with a cross section which is enlarged with respect to other portions of the tape and with an electrical resistance at said locations when in a normal conducting state which is smaller than at other locations of the tape.

9. In a method as recited in claim 1, said superconductor material being selected from the group consisting of lead or niobium and said pulverulent insulating material being selected from the group consisting of magnesium oxide and aluminum oxide.